(12) United States Patent
Carpenter et al.

(10) Patent No.: US 9,111,933 B2
(45) Date of Patent: Aug. 18, 2015

(54) STACKED THROUGH-SILICON VIA (TSV) TRANSFORMER STRUCTURE

(75) Inventors: Gary D. Carpenter, Austin, TX (US); Alan J. Drake, Round Rock, TX (US); Rachel Gordin, Hadera (IL); Michael J. Shapiro, Austin, TX (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 13/474,239

(22) Filed: May 17, 2012

(65) Prior Publication Data

US 2013/0307656 A1   Nov. 21, 2013

(51) Int. Cl.
*H01F 5/00*       (2006.01)
*H01F 27/28*      (2006.01)
*H01L 23/522*     (2006.01)
*H01L 23/48*      (2006.01)
*H01L 23/498*     (2006.01)

(52) U.S. Cl.
CPC .......... *H01L 23/5227* (2013.01); *H01L 23/481* (2013.01); *H01L 23/49827* (2013.01); *H01L 23/49816* (2013.01); *H01L 2224/16225* (2013.01); *H01L 2224/48091* (2013.01); *H01L 2224/48227* (2013.01); *H01L 2924/15311* (2013.01); *H01L 2924/30107* (2013.01); *Y10T 29/49071* (2015.01)

(58) Field of Classification Search
USPC ................................................. 336/200, 232
See application file for complete search history.

(56) References Cited

U.S. PATENT DOCUMENTS 3,486,149 A * 12/1969 Klein ............................ 336/192
5,095,357 A    3/1992 Andoh et al.
(Continued)

FOREIGN PATENT DOCUMENTS

JP         2011124250 A    6/2011
WO     WO 2011/033496 A1   3/2011

OTHER PUBLICATIONS

Aoki, Ichiro et al., "Distributed Active Transformer—A New Power-Combining and Impedance-Transformation Technique", IEEE Transactions on Microwave Theory and Techniques, vol. 50, No. 1, Jan. 2002, pp. 316-331.

(Continued)

*Primary Examiner* — Tsz Chan
(74) *Attorney, Agent, or Firm* — Francis Lammes; Stephen J. Walder, Jr.; William J. Stock

(57) ABSTRACT

A distributed active transformer is provided comprising a primary and a secondary winding. The primary winding comprises a first set of conductive vias extending in a direction between a first surface and a second surface of an element, a first set of first electrically conductive lines extending along the first surface, and a first set of second electrically conductive lines extending along the second surface. The secondary winding comprises a second set of conductive vias extending in a direction between the first surface and the second surface, a second set of first electrically conductive lines extending along the first surface, and a second set of second electrically conductive lines extending along the second surface. When energized, the primary winding generates magnetic flux extending in a direction parallel to the first surface and the second surface. The secondary winding receives energy transferred by the magnetic flux generated by the primary winding.

18 Claims, 6 Drawing Sheets

(56) References Cited

U.S. PATENT DOCUMENTS

| | | |
|---|---|---|
| 7,030,713 B2 | 4/2006 | Ralph |
| 7,298,238 B1* | 11/2007 | Eaton et al. ............ 336/200 |
| 7,388,462 B2 | 6/2008 | Ahn et al. |
| 7,728,427 B2 | 6/2010 | Gabara |
| 7,851,893 B2 | 12/2010 | Kim et al. |
| 7,935,570 B2 | 5/2011 | Lin et al. |
| 2002/0105406 A1* | 8/2002 | Liu et al. ............ 336/200 |
| 2004/0196132 A1* | 10/2004 | Yu et al. ............ 336/223 |
| 2005/0077991 A1* | 4/2005 | Beausoleil ............ 336/150 |
| 2005/0088269 A1* | 4/2005 | Hatano ............ 336/200 |
| 2010/0307798 A1 | 12/2010 | Izadian |
| 2011/0073987 A1 | 3/2011 | Mackh et al. |
| 2011/0084765 A1 | 4/2011 | Kim et al. |
| 2011/0128111 A1 | 6/2011 | Roozeboom et al. |
| 2011/0227689 A1 | 9/2011 | Chang et al. |
| 2011/0291232 A1 | 12/2011 | Yen et al. |
| 2011/0291786 A1* | 12/2011 | Li et al. ............ 336/200 |

OTHER PUBLICATIONS

Chen, Jiashu et al., "A compact 1V 18.6dBm 60GHz power amplifier in 65nm CMOS", IEEE International Solid-State Circuits Conference Digest of Technical Papers (ISSCC), San Francisco, California, Feb. 2011, pp. 432-433.

He, Ying et al., "60ghz power amplifier with distributed active transformer and local feedback", Proceedings of the ESSCIRC, Seville, Sep. 2010, pp. 314-317.

Shapiro, Michael et al., "Coil Inductor for On-Chip or On-Chip Stack", U.S. Appl. No. 13/289,071, filed Nov. 4, 2011, 25 pages.

Wu, Rongxiang et al., "Novel Silicon-Embedded Coreless Transformer for On-Chip Isolated Signal Transfer", Magnetic Letters, IEEE, vol. 2, 2011, 3 pages.

Zhang, Bo et al., "3D TSV Transformer Design for DC-DC/AC-DC Converter", 2010 Electronic Components and Technology Conference (ECTC), 2010, pp. 1653-1656.

* cited by examiner in accordance with an illustrative embodiment;

STACKED THROUGH-SILICON VIA (TSV) TRANSFORMER STRUCTURE

BACKGROUND

The present invention relates to semiconductor devices and their manufacture, and more specifically to a structure and method of making a stacked transformer structure using through-silicon vias (TSVs).

A transformer is a device that transfers electrical energy from one circuit to another through inductively coupled conductors or coils. A varying current in the first or primary winding creates a varying magnetic flux in the transformer and thus a varying magnetic field through a second or secondary winding. This varying magnetic field induces a varying electromotive force (EMF), or "voltage", in the secondary winding. This effect is referred to as inductive coupling.

Transformers range in size from on-chip transformers occupying the area less than one square millimeter to huge units weighing hundreds of tons used to interconnect portions of power grids. However, regardless of size, all transformers operate on the same basic principles, although the range of designs is wide. While new technologies have eliminated the need for transformers in some electronic circuits, transformers are still found in nearly all electronic devices.

SUMMARY

In one illustrative embodiment, a distributed active transformer (DAT) is provided. The distributed active transformer comprises a primary winding and a secondary winding. In the illustrative embodiment, the primary winding comprises a first set of conductive vias extending in a direction between a first surface and a second surface of an element. In the illustrative embodiment, the primary winding comprises a first set of first electrically conductive lines extending along the first surface. In the illustrative embodiment, the primary winding comprises a first set of second electrically conductive lines extending along the second surface. In the illustrative embodiment, the secondary winding comprises a second set of conductive vias extending in a direction between the first surface and the second surface. In the illustrative embodiment, the secondary winding comprises a second set of first electrically conductive lines extending along the first surface. In the illustrative embodiment, the secondary winding comprises a second set of second electrically conductive lines extending along the second surface. In the illustrative embodiment, when energized, the primary winding generates magnetic flux extending in a direction parallel to the first surface and the second surface. In the illustrative embodiment, the secondary winding receives energy transferred by the magnetic flux generated by the primary winding.

In yet another illustrative embodiment, a microelectronic element is provided having a distributed active transformer thereon. The distributed active transformer comprises a primary winding and a secondary winding. In the illustrative embodiment, the primary winding comprises a first set of conductive vias extending in a direction between a first surface and a second surface of an element. In the illustrative embodiment, the primary winding comprises a first set of first electrically conductive lines extending along the first surface. In the illustrative embodiment, the primary winding comprises a first set of second electrically conductive lines extending along the second surface. In the illustrative embodiment, the secondary winding comprises a second set of conductive vias extending in a direction between the first surface and the second surface. In the illustrative embodiment, the secondary winding comprises a second set of first electrically conductive lines extending along the first surface. In the illustrative embodiment, the secondary winding comprises a second set of second electrically conductive lines extending along the second surface. In the illustrative embodiment, when energized, the primary winding generates magnetic flux extending in a direction parallel to the first surface and the second surface. In the illustrative embodiment, the secondary winding receives energy transferred by the magnetic flux generated by the primary winding.

In yet another illustrative embodiment, a method of making a distributed active transformer is provided. In generating a primary winding, a first set of conductive vias is extended in a direction between a first surface and a second surface of an element. In generating a primary winding, a first set of first electrically conductive lines is extended along the first surface. In generating a primary winding, a first set of second electrically conductive lines along the second surface. In generating the secondary winding, a second set of conductive vias is extended in a direction between the first surface and the second surface. In generating the secondary winding, a second set of first electrically conductive lines is extended along the first surface. In generating the secondary winding, a second set of second electrically conductive lines is extended along the second surface. In this illustrative embodiment, when the distributed active transformer is energized, the primary winding generates magnetic flux extending in a direction parallel to the first surface and the second surface. In this illustrative embodiment, the secondary winding receives energy transferred by the magnetic flux generated by the primary winding.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a stacked transformer structure using through-silicon vias (TSVs). A stacked transformer structure is provided that can be fabricated in a microelectronic element such as a semiconductor chip, or interconnection element such as a semiconductor, glass or ceramic interposer element, which, when energized, transfers electrical energy from one circuit to another through inductively coupled conductors. Each circuit may include first conductive lines extending along the first surface of the microelectronic or interconnection element, second conductive lines extending along the second surface of the microelectronic or interconnection element, and a plurality of conductive vias, e.g., through-silicon vias (TSVs), extending in a direction of a thickness of the microelectronic or interconnection element. The TSV couplings are better than two facing spirals because the inner spiral turns do not enclose all the magnetic flux, while the double helix coils forming primary and secondary windings enclose almost the same magnetic flux. The primary and secondary winding may enclose a core of high magnetic permeability in order to further lower the external magnetic field and thereby increase the magnetic flux enclosed by both the primary and secondary windings.

Figure 1:
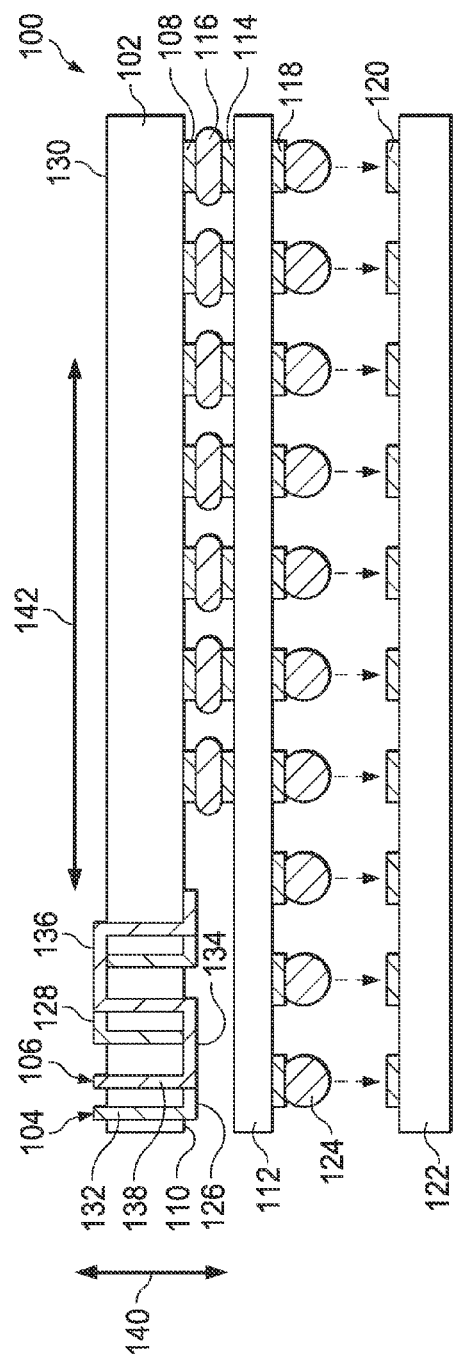
FIG. 1 illustrates a microelectronic package comprising a microelectronic element having a set of primary windings and a set of secondary windings formed thereon in accordance with an embodiment of the invention.

FIG. 1 illustrates microelectronic package 100 comprising microelectronic element 102 having a set of primary windings 104 and a set of secondary windings 106 formed thereon in accordance with an embodiment of the invention. As illustrated in FIG. 1, the microelectronic element 102 can be a semiconductor chip which embodies a plurality of active semiconductor devices, such as an integrated circuit chip, for example. In a particular example, the microelectronic element 102 may be a logic or processor chip, or may be a semiconductor chip or more than one semiconductor chip with additional conductive structure thereon such as a conductive redistribution layer. Such microelectronic element 102 may comprise a plurality of electrically conductive contacts 108 on a first surface 110 which faces substrate 112 of microelectronic package 100. In a particular embodiment, the set of primary windings 104 and secondary windings 106 are interlaced such that the magnetic flux generated by primary windings 104 generates a magnetic flux in secondary windings 106 through an inductive coupling. The primary windings 104 described herein may be capable of attaining a relatively high inductance on a microelectronic element or similarly-sized interconnection element while occupying a relatively small area of the microelectronic element or interconnection element.

In the microelectronic package 100, first surface 110 of the microelectronic element 102 may have a plurality of electrically conductive contacts 108 thereon which face corresponding contacts 114 of substrate 112 and are joined thereto via bonding connection 116, such as a bond metal, e.g., solder, tin, indium or a eutectic material, or other electrically conductive bond material. In turn, contacts 114 are electrically connected with a plurality of contacts 118 of microelectronic package 100. The plurality of contacts 118 are endpoints configured for electrically and mechanically coupling microelectronic package 100 with a component external to microelectronic package 100, such as to a plurality of contacts 120 on circuit panel 122, e.g., a circuit board, for example. As further shown in FIG. 1, the plurality of contacts 118 may couple to the plurality of contacts 120 via bonding connection 124, such as a bond metal, e.g., solder, tin, indium or a eutectic material, or other electrically conductive bond material.

As will be further described below, primary windings 104 includes first electrically conductive lines 126 extending along first surface 110 of microelectronic element 102, second electrically conductive lines 128 extending along second surface 130 of microelectronic element 102 that is opposite first surface 110, and electrically conductive vias 132 that extend in direction 140 through the thickness of microelectronic element 102 and electrically connect the first electrically conductive lines 126 and second electrically conductive lines 128. Similarly, secondary windings 106 includes first electrically conductive lines 134 extending along first surface 110 of microelectronic element 102, second electrically conductive lines 136 extending along second surface 130 of microelectronic element 102 that is opposite first surface 110, and electrically conductive vias 138 that extend in direction 140 through the thickness of microelectronic element 102 and electrically connect the first electrically conductive lines 134 and second electrically conductive lines 136. With this structure, primary windings 104, when energized, has magnetic flux which extends in a direction 142 parallel to the first surface 110 and second surface 130. Moreover, with this structure, peak magnetic flux exists between the first surface 110 and second surface 130 of the microelectronic element 102. The magnetic flux produced by primary windings 104 transfers electrical energy to secondary windings 106 through inductive coupling. Further description of the structure of primary windings 104 and secondary windings 106 is provided below with reference to particular embodiments below.

Figure 2:
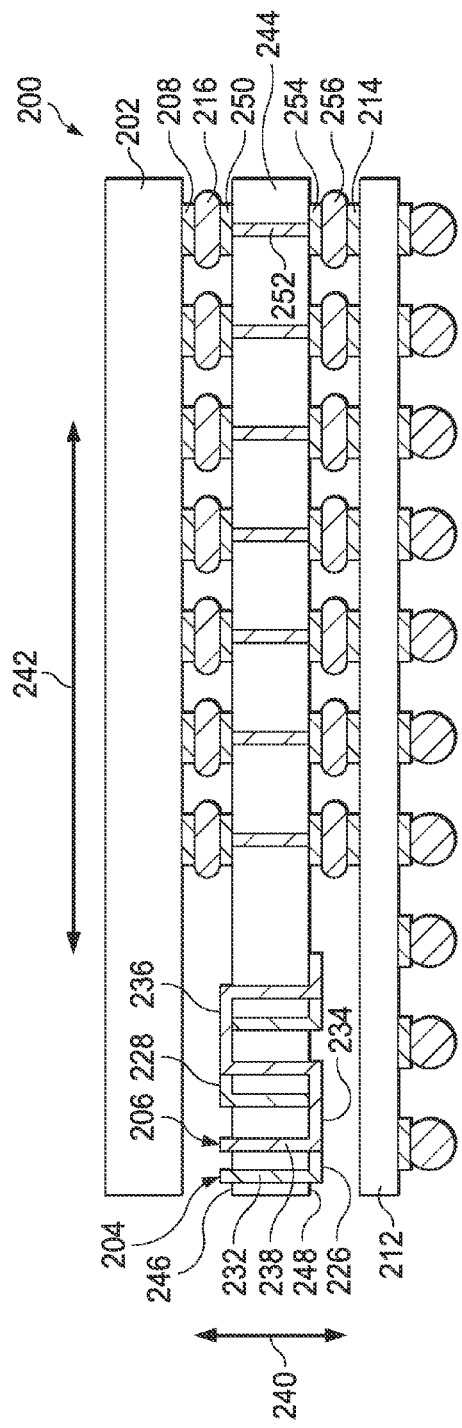
FIG. 2 illustrates an alternative embodiment where primary windings and secondary windings are provided in an interconnection element of a microelectronic package in accordance with an illustrative embodiment.

FIG. 2 illustrates an alternative embodiment where primary windings 204 and secondary windings 206, which are similar to primary windings 104 and secondary windings 106 of FIG. 1, are provided in an interconnection element 244 of microelectronic package 200 in accordance with an illustrative embodiment. As shown in FIG. 2, in microelectronic package 200 according to an alternative embodiment, primary windings 204 and secondary windings 206 having a structure as described above can be provided on interconnection element 244, which typically includes a region of semiconductor, glass, ceramic material, or the like, that makes up a majority of the thickness of interconnection element 244. The thickness of interconnection element 244 is typically less than 1000 microns. Interconnection element 244 can be an interposer configured to electrically interconnect an adjacent semiconductor chip, such as microelectronic element 202, via second surface 246 with an adjacent substrate 212 via first surface 248. Thus, interconnection element 244 may be electrically interconnected with substrate 212 in like manner as the electrical interconnection between the microelectronic element 202 and substrate 212.

Microelectronic element 202 may be electrically interconnected with the interconnection element 244 through contacts 208 of microelectronic element 202 which face corresponding contacts 250 on second surface 246 of interconnection element 244 adjacent thereto. That is, contacts 208 are coupled to contacts 250 of interconnection element 244 via bonding connection 216. Interconnection element 244 may comprise conductive through vias 252 which electrically connect contacts 250 facing microelectronic element 202 with contacts 254 on the first surface 248. Contacts 254 are further coupled to corresponding contacts 214 on substrate 212 via bonding connections 256, such as a bond metal, e.g., solder, tin, indium or a eutectic material, or other electrically conductive bond material.

Although microelectronic package 200 illustrates primary windings 204 and secondary windings 206 within interconnection element 244, as opposed to being within microelectronic element 102 of FIG. 1, primary windings 204 and secondary windings 206 function in a similar manner to primary windings 104 and secondary windings 106 of FIG. 1. That is, primary windings 204 includes first electrically conductive lines 226 extending along first surface 248 of interconnection element 244, second electrically conductive lines 228 extending along second surface 246 of interconnection element 244 that is opposite first surface 248, and electrically conductive vias 232 that extend in direction 240 through the thickness of interconnection element 244 and electrically connect the first electrically conductive lines 226 and second electrically conductive lines 228. Similarly, secondary windings 206 includes first electrically conductive lines 234 extending along first surface 248 of interconnection element 244, second electrically conductive lines 236 extending along second surface 246 of interconnection element 244 that is opposite first surface 248, and electrically conductive vias 238 that extend in direction 240 through the thickness of interconnection element 244 and electrically connect the first electrically conductive lines 234 and second electrically conductive lines 236.

With this structure, primary windings 204, when energized, has magnetic flux which extends in a direction 242 parallel to the first surface 248 and second surface 246. Moreover, with this structure, peak magnetic flux exists between the first surface 248 and second surface 246 of the interconnection element 244. The magnetic flux produced by primary windings 204 transfers electrical energy to secondary windings 206 through inductive coupling. Further description of the structure of primary windings 204 and secondary windings 206 is provided below with reference to particular embodiments below.

Figure 3:
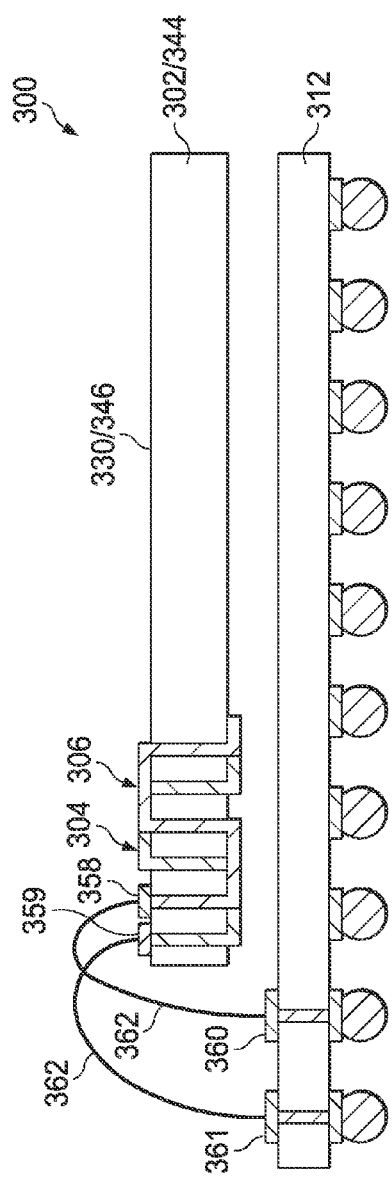
FIG. 3 illustrates yet other alternative embodiment where a microelectronic element and/or an interconnect element and a substrate have terminals thereon in accordance with an illustrative embodiment.

FIG. 3 illustrates yet other alternative embodiment where microelectronic element 302 and/or interconnect element 344 and substrate 312 have terminals thereon in accordance with an illustrative embodiment. Microelectronic package 300 according to another embodiment may be similar to those described above relative to FIG. 1 or 2. However, in FIG. 3, primary windings 304 and secondary windings 306 are formed on either microelectronic element 302 or interconnect element 344 which has electrical coupling terminals 358 and 359 on second surface 330 or 346 which faces away from the substrate 312. Electrical coupling terminals 358 and 359 are electrically coupled to electrical coupling terminals 360 and 361, respectively, on substrate 312, such as with wire bonds 362.

Figure 4:
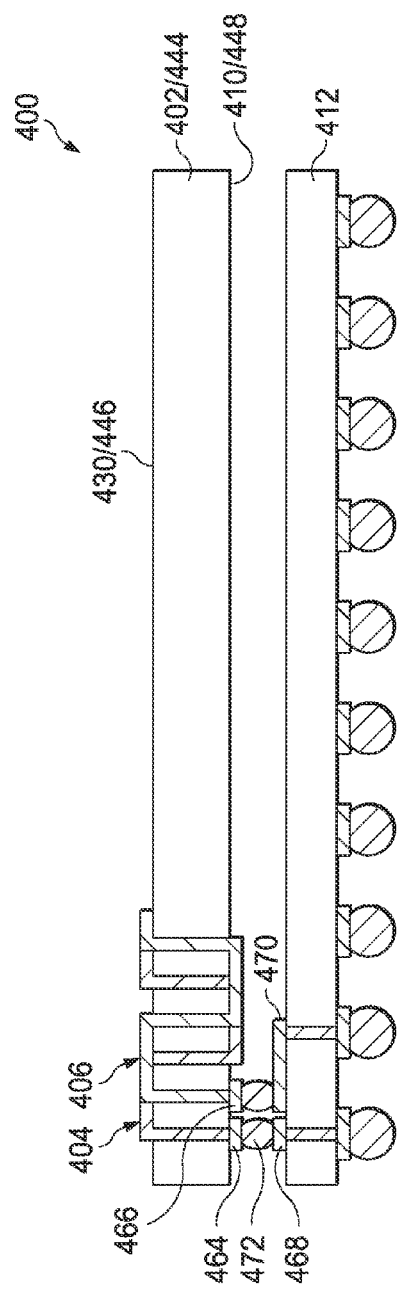
FIG. 4 illustrates yet other alternative embodiment where a microelectronic element and/or an interconnect element and a substrate have terminals thereon in accordance with an illustrative embodiment.

FIG. 4 illustrates yet other alternative embodiment where microelectronic element 402 and/or interconnect element 444 and substrate 412 have terminals thereon in accordance with an illustrative embodiment. Microelectronic package 400 according to another embodiment may be similar to those described above relative to FIG. 1 or 2. However, in FIG. 4, primary windings 404 and secondary windings 406 may optionally be electrically coupled to substrate 412 by electrical coupling terminal 464 associated with primary windings 404 and electrical coupling terminal 466 associated with secondary windings 406 exposed at first surface 410 or 448 to corresponding electrical coupling terminals 468 and 470 on substrate 412, respectively, such as via bonding connections 472, such as a bond metal, e.g., solder, tin, indium or a eutectic material, or other electrically conductive bond material.

Figure 5A:
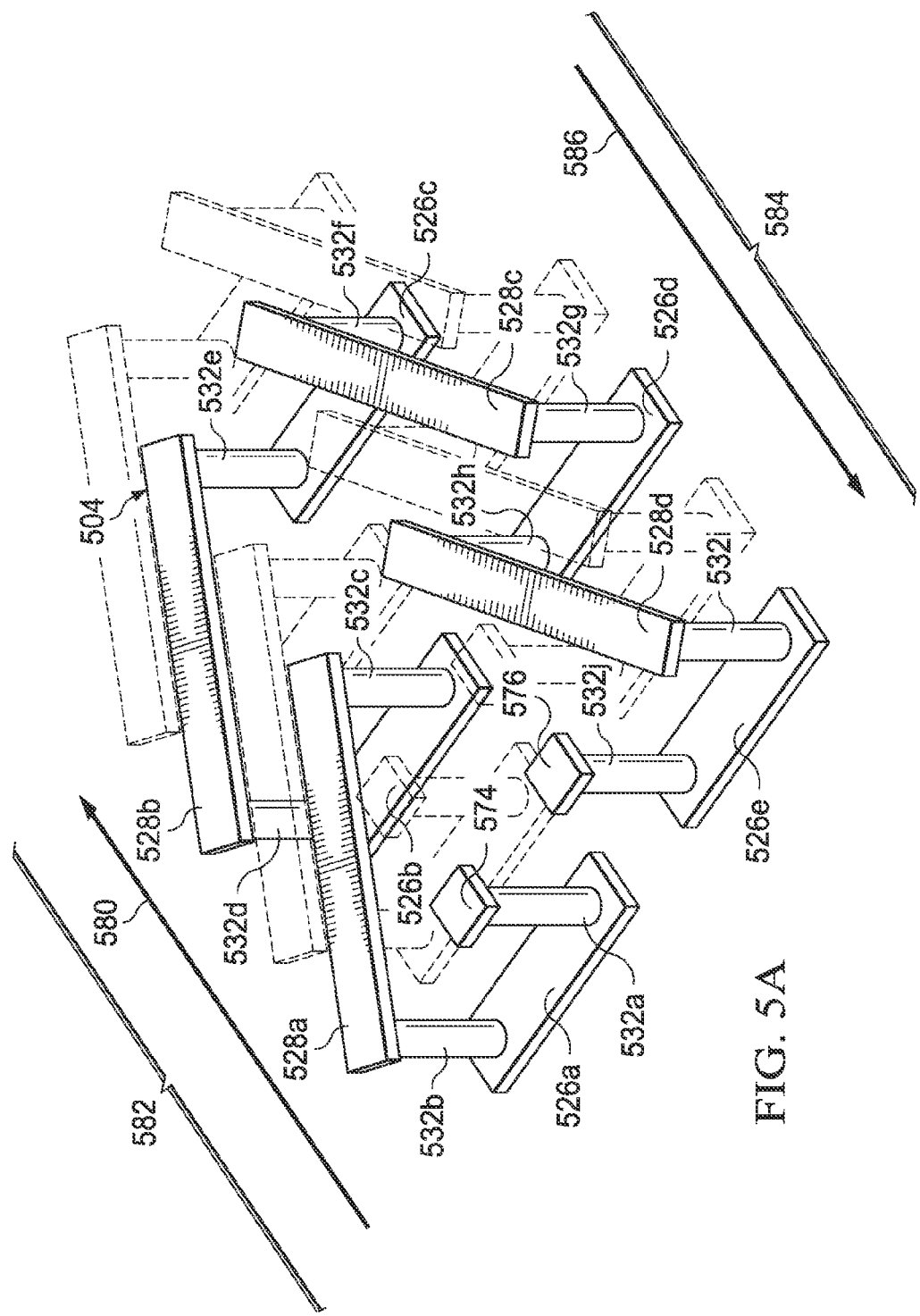
FIG. 5A illustrates the structure of primary windings which may be formed on microelectronic elements or interconnection elements in accordance with an illustrative embodiment.

FIG. 5A illustrates the structure of primary windings 504 of a distributed active transformer (DAT) which may be formed on any of microelectronic elements 102, 302, 402 of FIGS. 1, 3, and 4, respectively, or interconnection elements 244, 344, or 444, of FIGS. 2, 3, and 4, respectively, as described above in accordance with an illustrative embodiment. As depicted, primary windings 504 may have a continuous helical structure formed by first electrically conductive lines 526a-526e, on a first surface of the element (microelectronic element or interconnection element), second electrically conductive lines 528a-528d on a second surface of the element, and conductive vias 532a-532j, which extend in a direction of the thickness of the element and electrically connect first electrically conductive lines 526a-526e with second electrically conductive lines 528a-528d. Typically, conductive vias 532a-532j extend entirely through the thickness of a semiconductor, glass or ceramic region of the element such that first electrically conductive lines 526a-526e and second electrically conductive lines 528a-528d which are exposed at first and second opposing surfaces of the semiconductor, glass or ceramic region, respectively, contact conductive vias 532a-532j.

Thus, as seen in FIG. 5A, helical primary windings 504 are formed as a continuous electrically conductive path from electrical coupling terminal 574 conductive via 532a, first conductive line 526a, conductive via 532b, second conductive line 528a, conductive via 532c, first conductive line 526b, conductive via 532d, second conductive line 528b, conductive via 532e, first conductive line 526c, conductive via 532f, second conductive line 528c, conductive via 532g, first conductive line 526d, conductive via 532h, second conductive line 528d, conductive via 532i, first conductive line 526e, conductive via 532j, and electrical coupling terminal 576. As further shown in FIG. 5A, primary windings 504 are arranged as a set of first helical windings intertwined with a set of second helical winding or secondary windings in a double helix structure.

Figure 5B:
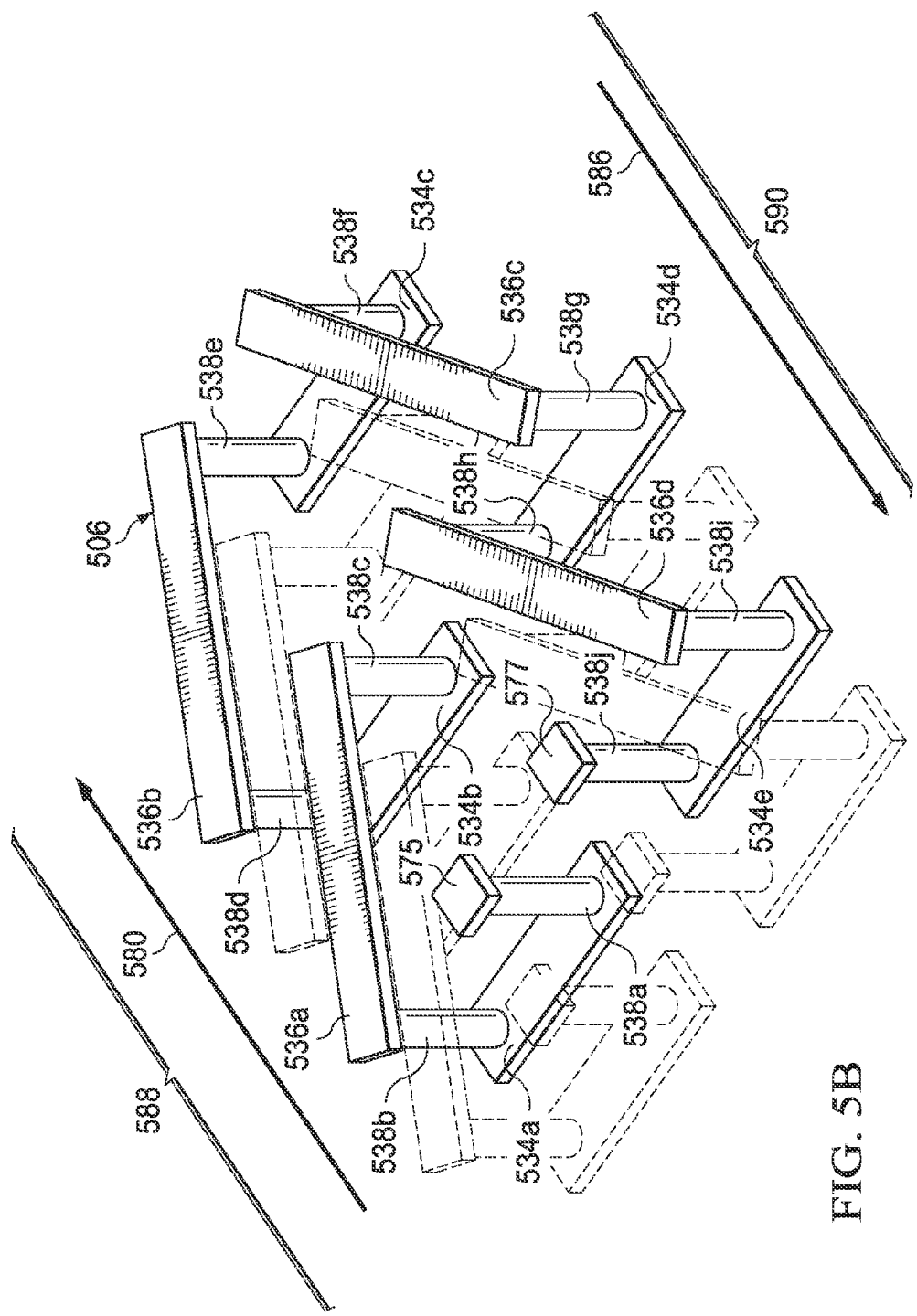
FIG. 5B illustrates the structure of secondary windings which may be formed on microelectronic elements or interconnection elements in accordance with an illustrative embodiment.

FIG. 5B illustrates the structure of secondary windings 506 of a distributed active transformer (DAT) which may be formed on any of microelectronic elements 102, 302, 402 of FIGS. 1, 3, and 4, respectively, or interconnection elements 244, 344, or 444, of FIGS. 2, 3, and 4, respectively, as described above in accordance with an illustrative embodiment. As depicted, secondary windings 506 may have a continuous helical structure formed by first electrically conductive lines 534a-534e, on a first surface of the element (microelectronic element or interconnection element), second electrically conductive lines 536a-536d on a second surface of the element, and conductive vias 538a-538j, which extend in a direction of the thickness of the element and electrically connect first electrically conductive lines 534a-534e with second electrically conductive lines 536a-536d. Typically, conductive vias 538a-538j extend entirely through the thickness of a semiconductor, glass or ceramic region of the element such that first electrically conductive lines 534a-534e and second electrically conductive lines 536a-536d which are exposed at first and second opposing surfaces of the semiconductor, glass or ceramic region, respectively, contact conductive vias 538a-538j.

Thus, as seen in FIG. 5B, helical secondary windings 506 are formed as a continuous electrically conductive path from electrical coupling terminal 575, conductive via 538a, first conductive line 534a, conductive via 538b, second conductive line 536a, conductive via 538c, first conductive line 534b, conductive via 538d, second conductive line 536b, conductive via 538e, first conductive line 534c, conductive via 538f, second conductive line 536c, conductive via 538g, first conductive line 534d, conductive via 538h, second conductive line 536d, conductive via 538i, first conductive line 534e, conductive via 538j, and electrical coupling terminal 577.

With reference to both FIGS. 5A and 5B, one will appreciate that primary windings 504 and secondary windings 506 encloses a volume which is internal to the semiconductor, glass or ceramic region that makes up the majority of the element's (microelectronic or interconnection element's) thickness. Moreover, primary windings 504 have a first plurality of turns 582 configured to generate magnetic flux which extends in a straight path in a direction 580 in a plane parallel to the first surface of the element. Specifically, in the example shown in FIG. 5A, primary windings 504 has a number N=2 of units of conductive double helical structures which repeat in the direction 580. It can also be seen that at least some of first electrically conductive lines 526a-526e extend in a direction transverse to the direction in which the magnetic flux extends. In addition, it can be seen that at least some of second electrically conductive lines 528a-528d extend in parallel paths which are orthogonal to direction 580. As further shown in FIG. 5A, primary windings 504 includes second plurality of turns 584 which are configured to direct the magnetic flux in direction 586 opposite direction 580. Here, in the example shown in FIG. 5A, primary windings 504 has a number N=2 of units of conductive double helical structures which repeat in direction 586 which is opposite direction 580.

Similar to that of FIG. 5A, secondary windings 506 have a first plurality of turns 588 configured to receive the energy transferred by the magnetic flux generated by primary windings 504 which extends in a straight path in a direction 580 in a plane parallel to the first surface of the element. Specifically, in the example shown in FIG. 5B, secondary windings 506 has a number N=2 of units of conductive double helical structures which repeat in the direction 580. It can also be seen that at least some of first electrically conductive lines 534a-534e extend in a direction transverse to the direction in which the magnetic flux extends. In addition, it can be seen that at least some of second electrically conductive lines 536a-536d extend in parallel paths which are orthogonal to direction 580. As further shown in FIG. 5B, secondary windings 506 includes second plurality of turns 590 which are configured to receive the energy transferred by the magnetic flux generated by primary windings 504 in direction 586 opposite direction 580. Here, in the example shown in FIG. 5B, secondary windings 506 has a number N=2 of units of conductive double helical structures which repeat in direction 586 which is opposite direction 580.

Figure 5C:
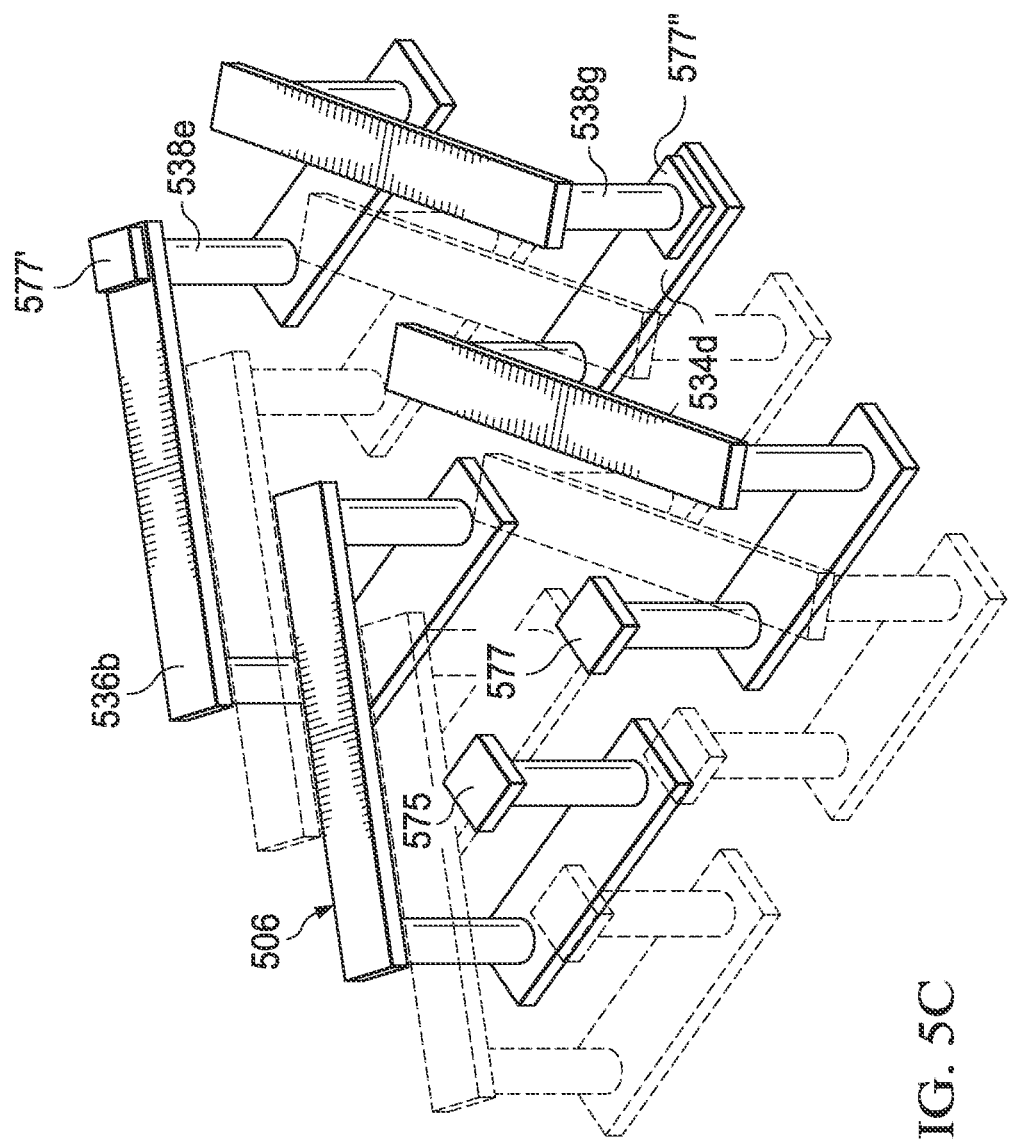
FIG. 5C depicts exemplary tapping points within secondary windings in order to obtain lower voltages in accordance with an illustrative embodiment.

The illustrative embodiment depicted in FIGS. 5A and 5B provides a 1:1 isolated energy transfer from primary windings 504 and secondary windings 506. However, the illustrative embodiments also provide for lower voltages from the secondary windings by providing different tapping points within the secondary windings. FIG. 5C depicts exemplary tapping points within secondary windings 506 of a distributed active transformer (DAT) in order to obtain lower voltages in accordance with an illustrative embodiment. That is, different lower voltages may be obtained from the energy transfer from primary windings 504 to secondary windings 506 if, for example, instead of connecting to electrical coupling terminal 577 as depicted in FIG. 5B a connection was located at the junction of second conductive line 536b and conductive via 538e thereby forming electrical coupling terminal 577'. As another example, a voltage lower than the illustrated location of electrical coupling terminal 577 as depicted in FIG. 5B and higher than the previous electrical coupling terminal 577' may be obtained if, for example, electrical coupling terminal 577 as depicted in FIG. 5B a connection was located at the junction of first conductive line 534d and conductive via 538g thereby forming electrical coupling terminal 577". Thus, as would be evident to one of ordinary skill in the art, when electrical coupling terminal 577 is moved closer to electrical coupling terminal 575, lower voltages may be obtained and, when electrical coupling terminal 577 is moved further away from electrical coupling terminal 575, higher voltages may be obtained, although the obtained voltage will never be higher than the voltage within primary windings 504.

Thus, the illustrative embodiments provide a stacked transformer structure using through-silicon vias (TSVs). A stacked transformer structure is provided that can be fabricated in a microelectronic element such as a semiconductor chip, or interconnection element such as a semiconductor, glass or ceramic interposer element, which, when energized, transfers electrical energy from one circuit to another through inductively coupled conductors. Each circuit may include first conductive lines extending along the first surface of the microelectronic or interconnection element, second conductive lines extending along the second surface of the microelectronic or interconnection element, and a plurality of conductive vias, e.g., through-silicon vias (TSVs), extending in a direction of a thickness of the microelectronic or interconnection element. The TSV couplings are better than two facing spirals because the inner spiral turns do not enclose all the magnetic flux, while the double helix coils forming primary and secondary windings enclose almost the same magnetic flux.

Figure 6:
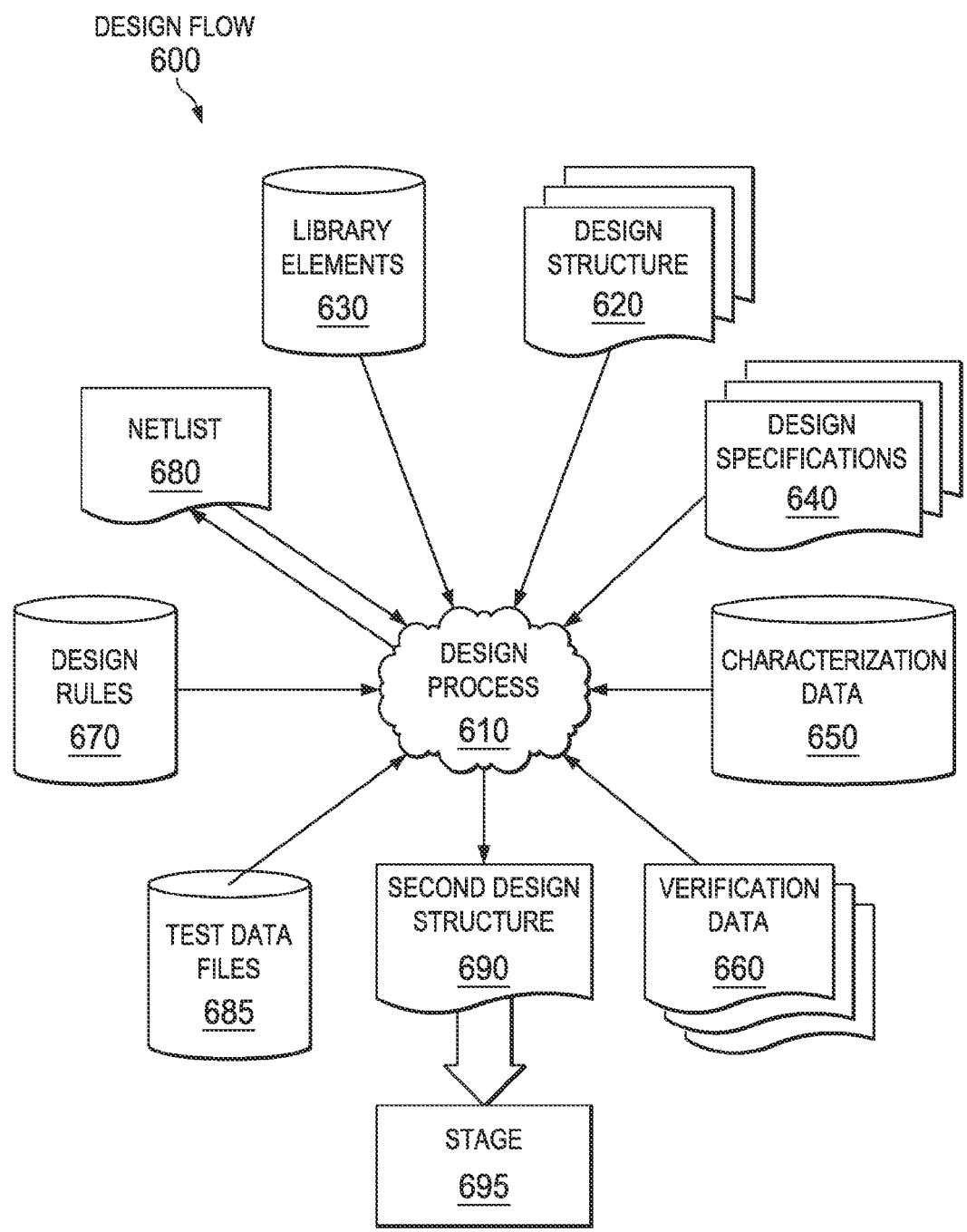
FIG. 6 shows a block diagram of an exemplary design flow used, for example, in semiconductor IC logic design, simulation, test, layout, and manufacture.

FIG. 6 shows a block diagram of an exemplary design flow 600 used, for example, in semiconductor IC logic design, simulation, test, layout, and manufacture. Design flow 600 includes processes and mechanisms for processing design structures to generate logically or otherwise functionally equivalent representations of the embodiments of the invention shown in FIGS. 2-5. The design structures processed and/or generated by design flow 600 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission or storage medium, design structure 620 may be accessed and processed by one or more hardware and/or software modules within design process 610 to simulate or otherwise functionally represent an electronic component, circuit, electronic or logic module, apparatus, device, or system such as those shown in FIGS. 2-5. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 2-5 to generate a netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include modules for performing standard circuit design processes such as timing analysis, verification, design rule checking, place and route operations, etc.

Design process 610 employs and incorporates well-known logic and physical design tools such as HDL compilers and simulation model build tools to process design structure 620 together with some or all of the depicted supporting data structures to generate a second design structure 690. Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-5. In one embodiment, design structure 690 may comprise a compiled, executable HDL simulation model that functionally simulates the devices shown in FIGS. 2-5.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 2-5. Design structure 690 may then proceed to a stage 695 where, for example, design structure 690 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A distributed active transformer comprising:
   a primary winding, comprising:
      a first set of conductive vias extending in a direction between a first surface and a second surface of an element;
      a first set of first electrically conductive lines extending along the first surface; and
      a first set of second electrically conductive lines extending along the second surface; and
   a secondary winding, comprising:
      a second set of conductive vias extending a direction between the first surface and the second surface;
      a second set of first electrically conductive lines extending along the first surface; and
      a second set of second electrically conductive lines extending along the second surface, wherein, when energized, the primary winding generates magnetic flux extending in a direction parallel to the first surface and the second surface, wherein the secondary winding receives energy transferred by the magnetic flux generated by the primary winding, wherein the secondary winding provides a plurality of tapping points, wherein at least one tapping point of the plurality tapping points is on the first surface located at a junction of a second electrically conductive line in the second set of first electrically conductive lines and a conductive via in the second set of conductive vias, and wherein at least one other tapping point of the plurality of tapping points is on the second surface located at a junction of a second electrically conductive line in the second set of second electrically conductive lines and a conductive via in the second set of conductive vias.

2. The distributed active transformer of claim 1, wherein the primary winding further comprises:
   one end of one conductive via in the first set of conductive vias coupled to a first terminal and the other end of the one conductive via coupled to a second end of an electrically conductive line in the first set of first electrically conductive lines;
   one or more of a first end of each first electrically conductive line in the first set of first electrically conductive lines coupled to a second end of each second electrically conductive line in the first set of second electrically conductive lines via a conductive via in the first set of conductive vias and a second end of each first electrically conductive line in the first set of first electrically conductive lines coupled to a first end of each second electrically conductive line in the first set of second electrically conductive lines via a different conductive via in the first set of conductive vias; and one end of another conductive via in the first set of conductive vias coupled to a second terminal and the other end of the other conductive via coupled to a second end of a different electrically conductive line in the first set of first electrically conductive lines.

3. The distributed active transformer of claim 1, wherein the first set of conductive vias, the first set of first electrically conductive lines, and the first set of second electrically conductive lines are arranged to form the primary winding having a first helical structure, wherein the second set of conductive vias, the second set of first electrically conductive lines, and the second set of second electrically conductive lines are arranged to form the secondary winding having a second helical structure, wherein the secondary winding is intertwined with the primary winding.

4. The distributed active transformer of claim 3, wherein the secondary winding is intertwined with the primary winding in a double helix structure.

5. The distributed active transformer of claim 1, wherein the secondary winding further comprises:

one end of one conductive via in the second set of conductive vias coupled to a first terminal and the other end of the one conductive via coupled to a second end of an electrically conductive line in the second set of first electrically conductive lines;

one or more of a first end of each first electrically conductive line in the second set of first electrically conductive lines coupled to a second end of each second electrically conductive line in the second set of second electrically conductive lines via a conductive via in the second set of conductive vias and a second end of each first electrically conductive line in the second set of first electrically conductive lines coupled to a first end of each second electrically conductive line in the second set of second electrically conductive lines via a different conductive via in the second set of conductive vias; and one end of another conductive via in the second set of conductive vias coupled to a second terminal and the other end of the other conductive via coupled to a second end of a different electrically conductive line in the second set of first electrically conductive lines.

6. The distributed active transformer of claim 1, wherein the voltage induced by the magnetic flux of the primary winding on the secondary winding is less at a tapping point in the plurality of tapping points that is closer to a first terminal of the secondary winding and wherein the voltage induced by the magnetic flux of the primary winding on the secondary winding is more at a tapping point in the plurality of tapping points that is further from the first terminal of the secondary winding.

7. A microelectronic element having a transformer thereon, comprising:

a semiconductor chip embodying a plurality of active devices, the semiconductor chip having a first surface and a second surface, wherein the first surface opposes the second surface and wherein the transformer comprises:

a primary winding, comprising:

a first set of conductive vias extending in a direction between the first surface and the second surface;

a first set of first electrically conductive lines extending along the first surface; and a first set of second electrically conductive lines extending along the second surface; and a secondary winding, comprising:

a second set of conductive vias extending in a direction between the first surface and the second surface;

a second set of first electrically conductive lines extending along the first surface; and a second set of second electrically conductive lines extending along the second surface, wherein, when energized, the primary winding generates magnetic flux extending in a direction parallel to the first surface and the second surface, wherein the secondary winding receives energy transferred by the magnetic flux generated by the primary winding, wherein the secondary winding provides a plurality of tapping points, wherein at least one tapping point of the plurality of tapping points is on the first surface located at a junction of a second electrically conductive line in the second set of first electrically conductive lines and a conductive via in the second set of conductive vias, and wherein at least one other tapping point of the plurality of tapping points is on the second surface located at a junction of a second electrically conductive line in the second set of second electrically conductive lines and a conductive via in the second set of conductive vias.

8. The microelectronic element of claim 7, wherein the primary winding further comprises:

one end of one conductive via in the first set of conductive vias coupled to a first terminal and the other end of the one conductive via coupled to a second end of an electrically conductive line in the first set of first electrically conductive lines;

one or more of a first end of each first electrically conductive line in the first set of first electrically conductive lines coupled to a second end of each second electrically conductive line in the first set of second electrically conductive lines via a conductive via in the first set of conductive vias and a second end of each first electrically conductive line in the first set of first electrically conductive lines coupled to a first end of each second electrically conductive line in the first set of second electrically conductive lines via a different conductive via in the first set of conductive vias; and one end of another conductive via in the first set of conductive vias coupled to a second terminal and the other end of the other conductive via coupled to a second end of a different electrically conductive line in the first set of first electrically conductive lines.

9. The microelectronic element of claim 7, wherein the first set of conductive vias, the first set of first electrically conductive lines, and the first set of second electrically conductive lines are arranged to form the primary winding having a first helical structure, wherein the second set of conductive vias, the second set of first electrically conductive lines, and the second set of second electrically conductive lines are arranged to form the secondary winding having a second helical structure, wherein the secondary winding is intertwined with the primary winding.

10. The microelectronic element of claim 9, wherein the secondary winding is intertwined with the primary winding in a double helix structure.

11. The microelectronic element of claim 7, wherein the secondary winding further comprises:

one end of one conductive via in the second set of conductive vias coupled to a first terminal and the other end of the one conductive via coupled to a second end of an electrically conductive line in the second set of first electrically conductive lines;
one or more of a first end of each first electrically conductive line in the second set of first electrically conductive lines coupled to a second end of each second electrically conductive line in the second set of second electrically conductive lines via a conductive via in the second set of conductive vias and a second end of each first electrically conductive line in the second set of first electrically conductive lines coupled to a first end of each second electrically conductive line in the second set of second electrically conductive lines via a different conductive via in the second set of conductive vias; and
one end of another conductive via in the second set of conductive vias coupled to a second terminal and the other end of the other conductive via coupled to a second end of a different electrically conductive line in the second set of first electrically conductive lines.

12. The microelectronic element of claim 7, wherein the voltage induced by the magnetic flux of the primary winding on the secondary winding is less at a tapping point in the plurality of tapping points that is closer to a first terminal of the secondary winding and wherein the voltage induced by the magnetic flux of the primary winding on the secondary winding is more at a tapping point in the plurality of tapping points that is further from the first terminal of the secondary winding.

13. A method of making a distributed active transformer comprising:
generating a primary winding by:
extending a first set of conductive vias in a direction between a first surface and a second surface of an element;
extending a first set of first electrically conductive lines along the first surface; and
extending a first set of second electrically conductive lines along the second surface; and
generating a secondary winding by:
extending a second set of conductive vias in a direction between the first surface and the second surface:
extending a second set of first electrically conductive lines along the first surface; and
extending a second set of second electrically conductive lines along the second surface, wherein, when energized, the primary winding generates magnetic flux extending in a direction parallel to the first surface and the second surface, wherein the secondary winding receives energy transferred by the magnetic flux generated by the primary winding, wherein the secondary winding provides a plurality of tapping points, wherein at least one tapping point of the plurality of tapping points is on the first surface located at a junction of a second electrically conductive line in the second set of first electrically conductive lines and a conductive via in the second set of conductive vias, and wherein at least one other tapping point of the plurality of tapping points is on the second surface located at a junction of a second electrically conductive line in the second set of second electrically conductive lines and a conductive via in the second set of conductive vias.

14. The method of claim 13, wherein generating the primary winding further comprises:
coupling one end of one conductive via in the first set of conductive vias to a first terminal and coupling the other end of the one conductive via to a second end of an electrically conductive line in the first set of first electrically conductive lines;
coupling one or more of a first end of each first electrically conductive line in the first set of first electrically conductive lines to a second end of each second electrically conductive line in the first set of second electrically conductive lines via a conductive via in the first set of conductive vias and coupling a second end of each first electrically conductive line in the first set of first electrically conductive lines to a first end of each second electrically conductive line in the first set of second electrically conductive lines via a different conductive via in the first set of conductive vias; and
coupling one end of another conductive via in the first set of conductive vias to a second terminal and coupling the other end of the other conductive via to a second end of a different electrically conductive line in the first set of first electrically conductive lines.

15. The method of claim 13, wherein the first set of conductive vias, the first set of first electrically conductive lines, and the first set of second electrically conductive lines are arranged to form the primary winding having a first helical structure, wherein the second set of conductive vias, the second set of first electrically conductive lines, and the second set of second electrically conductive lines are arranged to form the secondary winding having a second helical structure, wherein the secondary winding is intertwined with the primary winding.

16. The method of claim 15, wherein the secondary winding is intertwined with the primary winding in a double helix structure.

17. The method of claim 13, wherein generating the secondary winding further comprises:
coupling one end of one conductive via in the second set of conductive vias to a first terminal and coupling the other end of the one conductive via to a second end of an electrically conductive line in the second set of first electrically conductive lines;
coupling one or more of a first end of each first electrically conductive line in the second set of first electrically conductive lines to a second end of each second electrically conductive line in the second set of second electrically conductive lines via a conductive via in the second set of conductive vias and coupling a second end of each first electrically conductive line in the second set of first electrically conductive lines to a first end of each second electrically conductive line in the second set of second electrically conductive lines via a different conductive via in the second set of conductive vias; and
coupling one end of another conductive via in the second set of conductive vias to a second terminal and coupling the other end of the other conductive via to a second end of a different electrically conductive line in the second set of first electrically conductive lines.

18. The method of claim 13, wherein the voltage induced by the magnetic flux of the primary winding on the secondary winding is less at a tapping point in the plurality of tapping points that is closer to a first terminal of the secondary winding and wherein the voltage induced by the magnetic flux of the primary winding on the secondary winding is more at a tapping point in the plurality of tapping points that is further from the first terminal of the secondary winding.

* * * * *